United States Patent [19]
Lu

[11] Patent Number: 6,087,252
[45] Date of Patent: Jul. 11, 2000

[54] DUAL DAMASCENE

[75] Inventor: Jau-Hone Lu, Hsinchu Hsien, Taiwan

[73] Assignee: United Integrated Circuits Corp., Hsinchu, Taiwan

[21] Appl. No.: 09/306,092

[22] Filed: May 6, 1999

[30] Foreign Application Priority Data

Mar. 4, 1999 [TW]  Taiwan ................................. 88103284

[51] Int. Cl.⁷ .............................................. H01L 21/4763
[52] U.S. Cl. .......................... 438/638; 438/639; 438/666; 438/668
[58] Field of Search .................... 438/638, 639, 438/666, 668

[56] References Cited

U.S. PATENT DOCUMENTS

| | | | |
|---|---|---|---|
| 5,916,823 | 6/1999 | Lou et al. | 438/738 |
| 6,025,276 | 2/2000 | Donohoe et al. | 438/734 |
| 6,037,194 | 3/2000 | Bronner et al. | 438/147 |

*Primary Examiner*—John F. Niebling
*Assistant Examiner*—Lynne A. Gurley
*Attorney, Agent, or Firm*—J. C. Patents; Jiawei Huang

[57] ABSTRACT

An improved dual damascene process is provided. By a spacer formed on sidewalls of an oxide layer, the method can make a via plug and a metal layer serving as an interconnect simultaneously form in a self-aligned process. Therefore, it can successfully avoid misalignment while forming a via plug and an interconnect.

8 Claims, 6 Drawing Sheets

DUAL DAMASCENE

CROSS-REFERENCE TO RELATED APPLICATION

This application claims the priority benefit of Taiwan application serial no. 88103284, filed Mar. 4, 1999, the full disclosure of which is incorporated herein by reference.

BACKGROUND OF THE INVENTION

1. Field of Invention

The present invention relates to a semiconductor process. More particularly, the present invention relates to a dual damascene process.

2. Description of Related Art

In a conventional method of fabricating multilevel interconnects, a metal layer is deposited on an insulating layer, such as an oxide layer. The metal layer is then defined to form a conductive line. A dielectric layer having an opening is formed over the conductive line, and the conductive line is exposed by the opening. The opening is filled with a metal layer so as to be electrically connected with the conductive line. With an increase of required conductive layers in integrated circuits, more than two conductive layers are necessary according to the design rule. An inter-metal dielectric (IMD) layer is usually formed between two conductive layers in order to insulate the conductive layers. A conductive line is formed between the two conductive layers as an electrical connection. The conductive line is called a via in the semiconductor industry.

In a conventional method, the via and the interconnects are formed in different steps. A dielectric layer is formed on a metal layer. A photoresist layer is formed on the dielectric layer. Using the photoresist layer as a mask, the dielectric layer is etched. A via hole is formed in the dielectric layer, and the metal layer is exposed by the via hole. A conductive material is formed by deposition. At this stage, a complete via is formed. Then, a metal layer is formed over the dielectric layer. The metal layer is defined. Finally, an inter-metal dielectric layer is deposited. By this method, interconnects are formed. However, since the conventional method is to first form the via, and then to form the metal layer, misalignment easily occurs while forming the subsequent metal layer. Misalignment causes an error in the integrated circuits (IC) and a decrease of device yield.

SUMMARY OF THE INVENTION

Accordingly, the present invention provides an improved dual damascene process. The method can simultaneously form a via plug and a metal layer serving as an interconnect by self-alignment. Therefore, the method can successfully avoid misalignment while forming a via plug and an interconnect.

The invention provides a dual damascene process. A semiconductor substrate is provided. A conductive line is formed on the substrate. A dielectric layer is formed over the substrate to cover the conductive line. A first mask layer and a cap oxide layer are sequentially formed on the substrate. The cap oxide layer is defined to form an opening to expose a part of the first mask layer wherein the first opening is positioned over the substrate in which a required via hole is to be subsequently formed. A conformal second mask layer is formed along the opening and on the cap oxide layer. A part of the second mask layer is removed to form a spacer on sidewalls of the opening wherein a part of the first mask layer at a bottom of the opening is simultaneously removed to expose a part of the dielectric layer. A photoresist layer with an interconnect pattern is formed on the cap oxide layer. The cap oxide layer and a part of the dielectric layer are anisotropically etched to form a via hole in the dielectric layer to expose the conductive line using the photoresist layer and the spacer as a mask. The photoresist layer is removed. The spacer and the first mask layer exposed by the cap oxide layer are removed to form a horizontal trench using the insulating layer as an end point. A conductive layer is formed in the second opening and the horizontal trench.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 2A through 2G are schematic, top views of FIGS. 1A through 1G, respectively, in which FIGS. 1A through 1G are cross-sectional views taken along a cutting line I—I in FIGS. 2A through 2E.

DESCRIPTION OF THE PREFERRED EMBODIMENTS

Figure 1A:
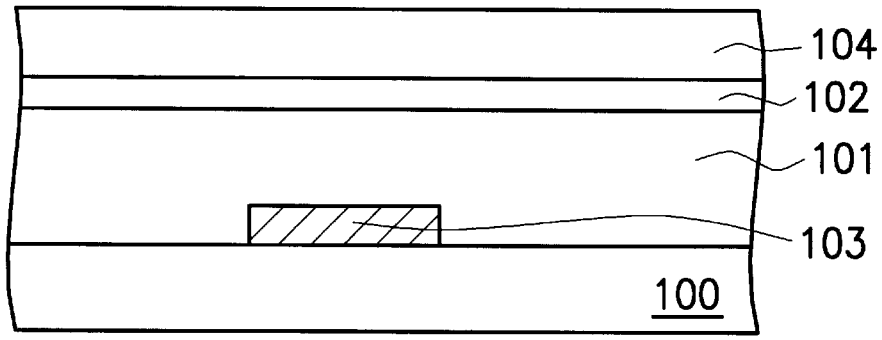
FIGS. 1A through 1G are schematic, cross-sectional views showing a dual damascene process according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic, cross-sectional views showing a dual damascene process according to one preferred embodiment of this invention. FIGS. 2A through 2G are schematic, top views of FIGS. 1A through 1G in which FIGS. 1A through 1G are cross-sectional vies taken along a cutting line I—I in FIGS. 2A through 2E.

Figure 2A:
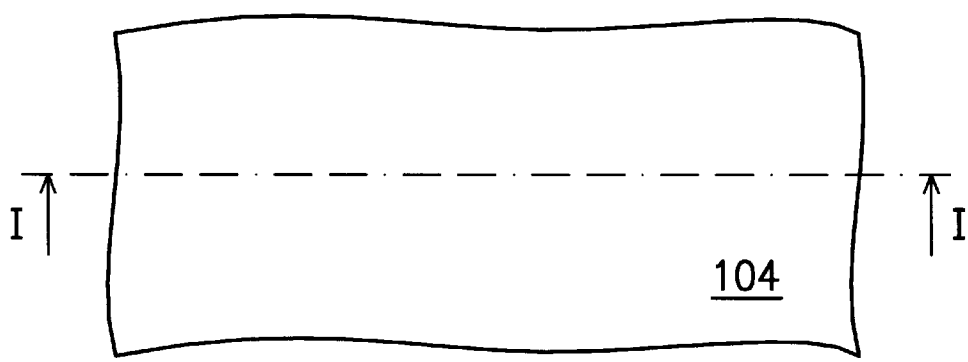

Simultaneously referring to FIG. 1A and FIG. 2A, a semiconductor substrate 100 is provided. The substrate 100 includes preformed semiconductor devices (not shown) such as a metal oxide semiconductor (MOS) transistor and a dielectric layer formed thereon for isolation. A conductive line 103 is formed on the substrate 100. A dielectric layer 101 is formed over the substrate 100 to cover the conductive line 103. The dielectric layer includes, for example, silicon oxide. A mask layer 102 is formed on the dielectric layer 101. The mask layer 102 is preferably made of silicon nitride, and is formed by, for example, chemical vapor deposition (CVD). A cap oxide layer 104 is formed on the mask layer 102 by, for example, CVD. The cap oxide layer 104 is preferably made of the same material as the dielectric layer 101. The cap oxide layer 104 includes, for example, silicon oxide.

Figure 1B:
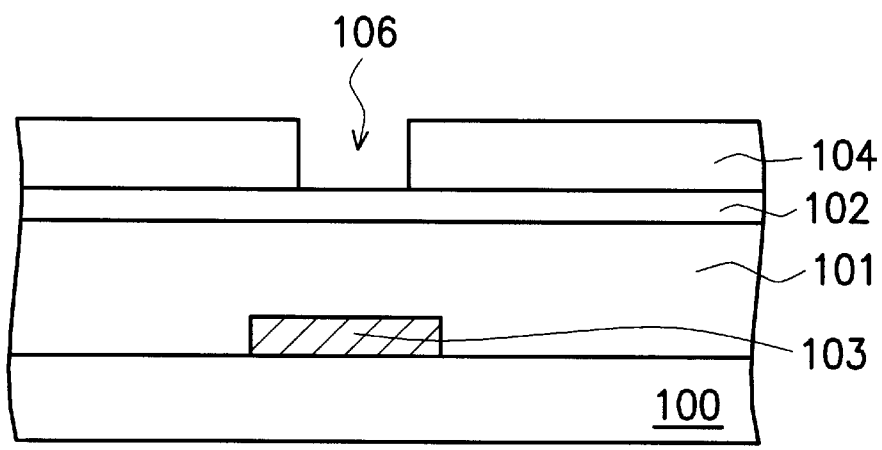
Figure 2B:
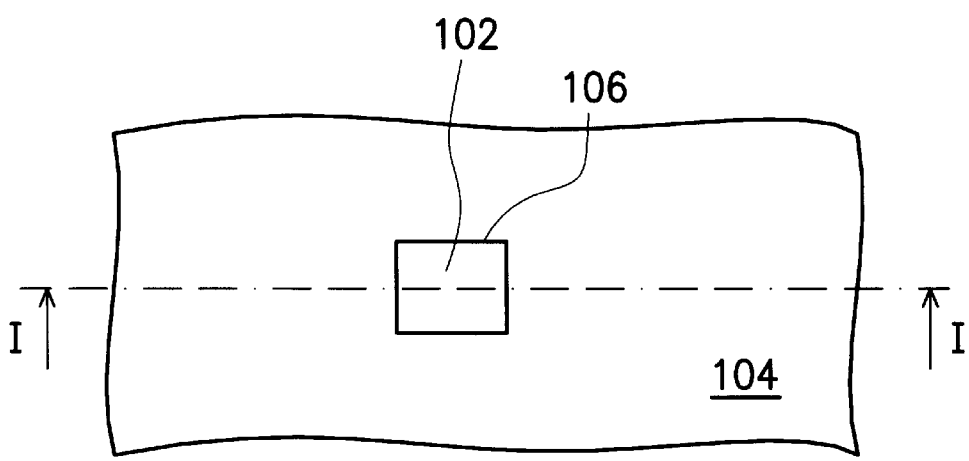

Simultaneously referring to FIG. 1B and FIG. 2B, the cap oxide layer 104 is defined to form an opening 106 in the cap oxide layer 104 to expose a part of the mask layer 102. The cap oxide layer 104 is defined by photolithography and etching. The opening 106 is positioned over the substrate 100 in a place where a required via hole is to be subsequently formed.

Figure 1C:
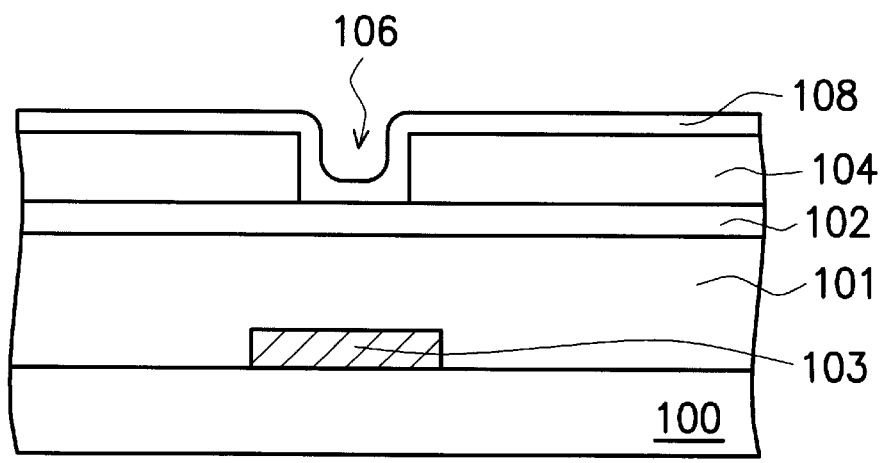
Figure 2C:
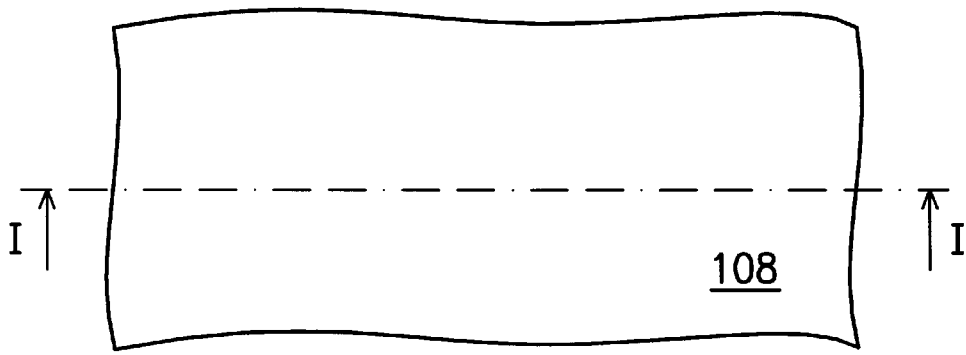

Simultaneously referring to FIG. 1C and FIG. 2C, another conformal mask layer 108 is formed along the opening 106 and on the cap oxide layer 104. The mask layer 108 is preferably made of the same material as the mask layer 102 to benefit a subsequent etching process. The mask layer 108 includes, for example, silicon nitride, and is formed by, for example, CVD.

Figure 1D:
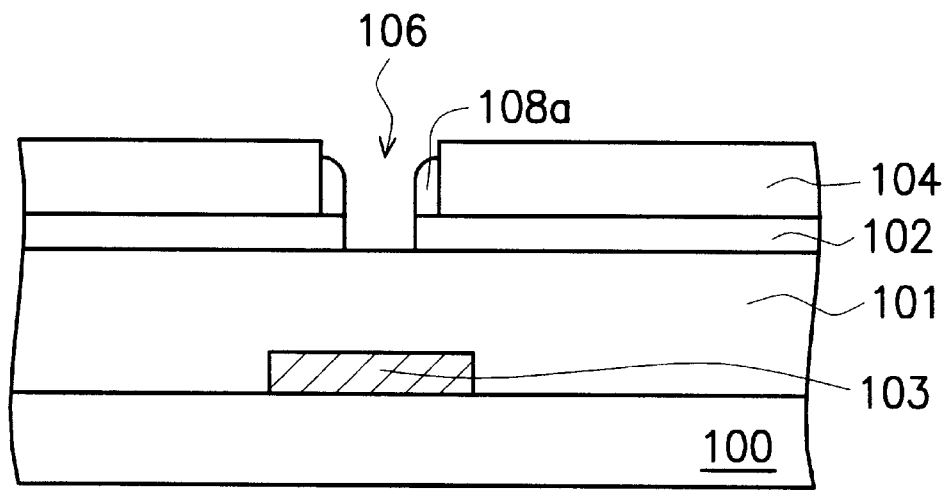
Figure 2D:
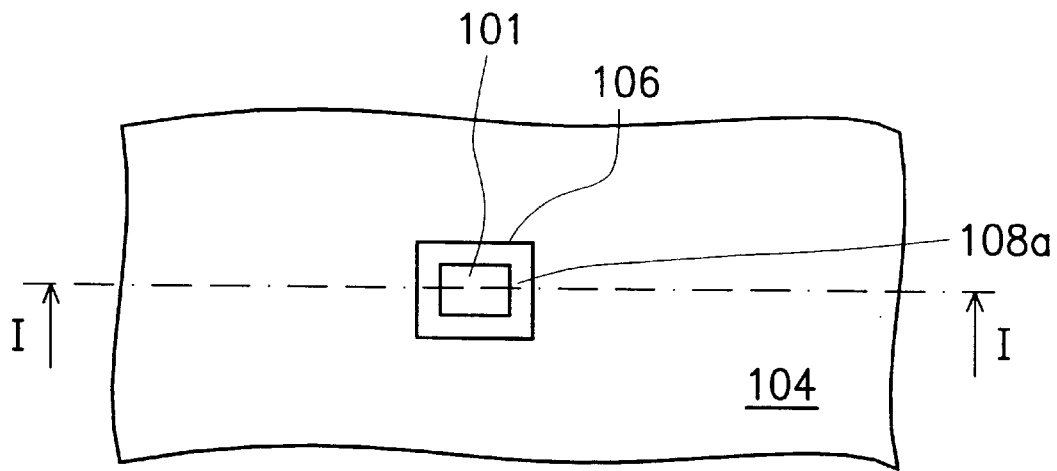

Simultaneously referring to FIG. 1D and FIG. 2D, the portion of the mask layer 108 covering the upper surface of the cap oxide layer 104 (FIG. 1C) is removed to form a spacer 108a on sidewalls of the opening 106. The spacer 108a is formed from the remaining portion of the mask layer 108, and includes, for example, silicon nitride. The removal method includes, for example, dry etching. At this step, since the mask layer 102 and the mask layer 108 (FIG. 1C) have the same material, a part of the mask layer 102 at the bottom of the opening 106 is simultaneously removed to expose a part of the dielectric layer 101.

Figure 1E:
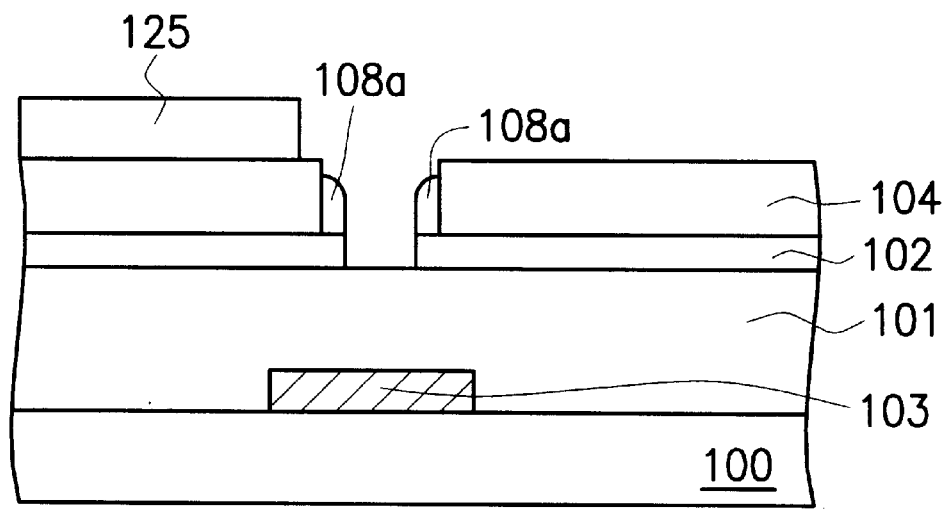
Figure 2E:
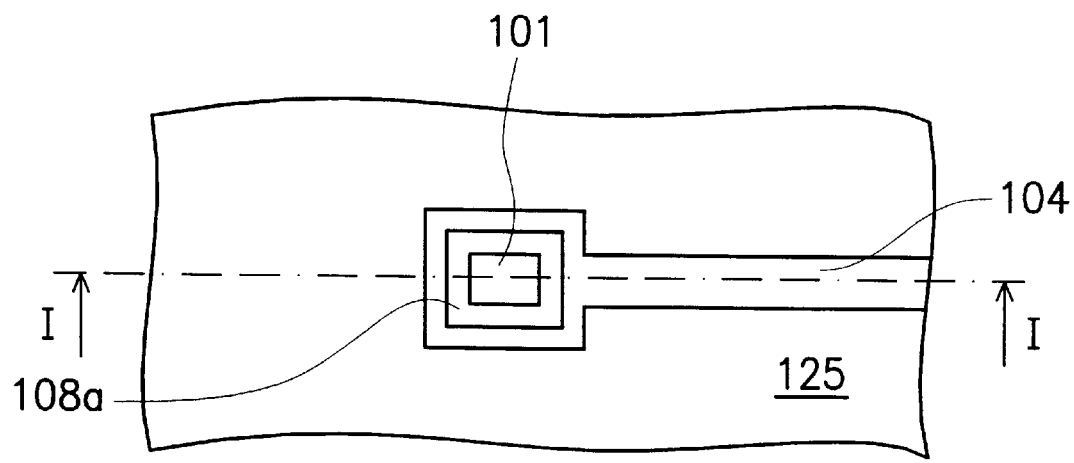

Simultaneously referring to FIG. 1E and FIG. 2E, a photoresist layer is formed on the cap oxide layer 104. The photoresist layer is defined to form a photoresist layer 125 with a pattern of a required interconnect to be formed subsequently. A part of the cap oxide layer 104 is exposed by the patterned photoresist layer 125.

Figure 1F:
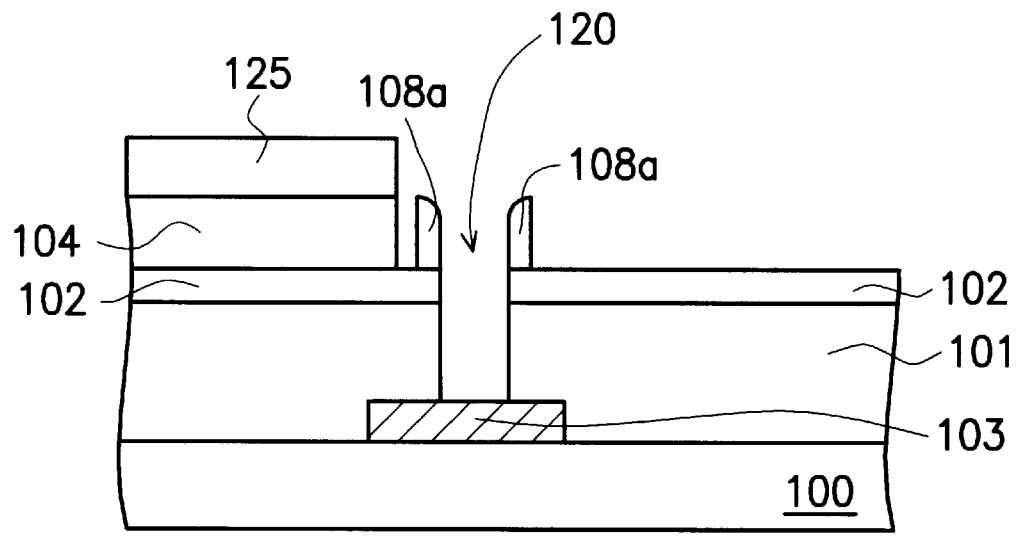
Figure 2F:
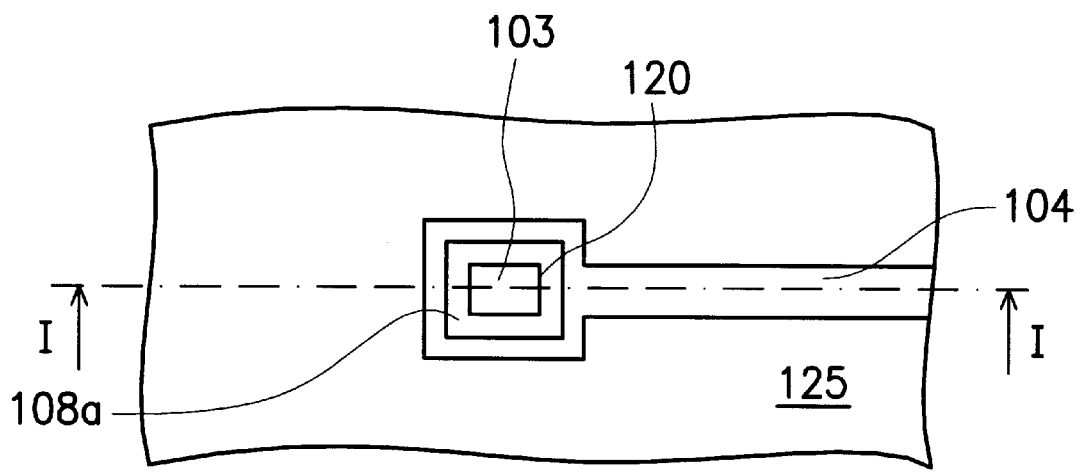

Simultaneously referring to FIG. 1F and FIG. 2F, using the patterned photoresist layer 125, the mask layer 102, and the spacer 108a as a mask, the cap oxide layer 104 and the dielectric layer 101 are anisotropically etched to form a via hole 120 in the dielectric layer 101 to expose the conductive line 103. The mask layer 102 serves as an etching end point for this etching step so as to expose the mask layer 102. The part of the cap oxide layer 104 exposed by the patterned photoresist layer 125 is removed, as shown in FIG. 1F. The cap oxide layer 104 and a part of the dielectric layer 101 are removed by, for example, dry etching. The removed cap oxide layer 104 and the via hole 120 are respectively positioned on areas in which a required interconnect and a required via plug are to be subsequently formed. In other words, the interconnect and the via plug can be simultaneously formed. In the conventional method, since a via plug is formed and then the interconnect is formed, they are formed in two steps, so as to cause misalignment while forming the subsequent interconnect. Therefore, the invention can successfully avoid the conventional drawback of misalignment.

Figure 1G:
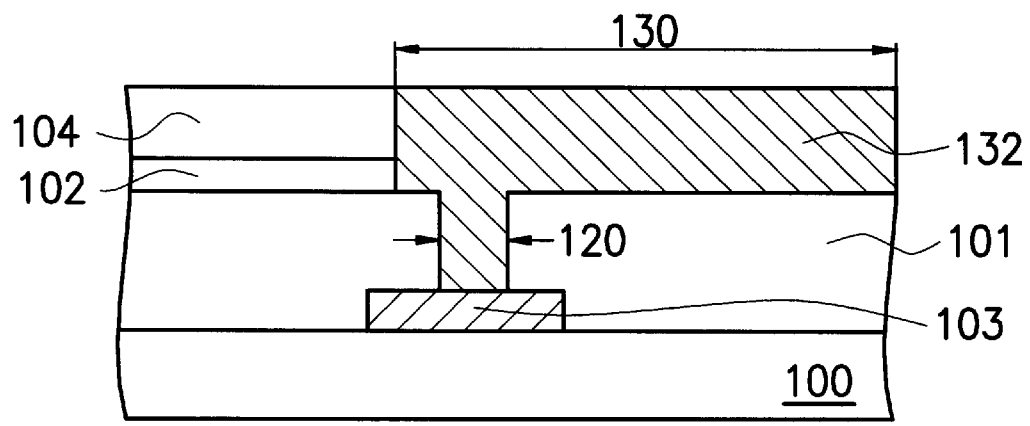
Figure 2G:
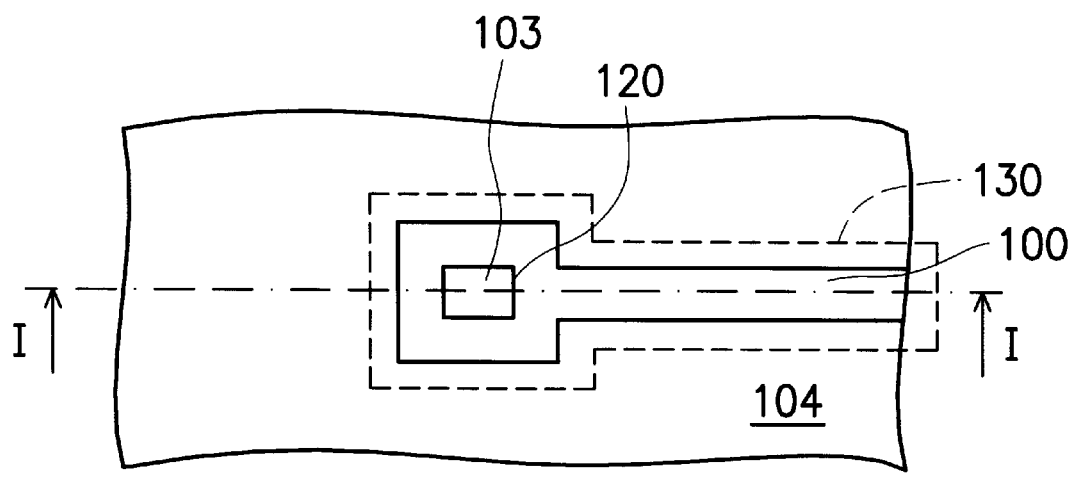

Simultaneously referring to FIG. 1G and FIG. 2G, using the photoresist layer 125 (FIG. 1F) as a mask and using the dielectric layer 101 as an etching end point, the spacer 108a (FIG. 1F) and the mask layer 102 exposed by the photoresist layer 125 (FIG. 1F) are removed. Thus a horizontal trench 130 serving as a subsequent interconnect is formed. The photoresist layer 125 is removed.

A conductive material layer is formed over the substrate 100 to fill the horizontal trench 130 and the opening 120. A planarization process such as chemical mechanical polishing (CMP) is performed to remove the unwanted conductive material layer on the cap oxide layer 104 until the cap oxide layer 104 is exposed. Thus, a conductive layer 132 is formed in the opening 120 and in the horizontal trench 130 so as to simultaneously form a via plug and an interconnect. The via plug is electrically coupled to the conductive line 103 and the interconnect. At this step, a dual damascene is complete.

Accordingly, the invention is to simultaneously define the interconnect and the via hole so that the interconnect and the via plug can be formed in a self-aligned process. In the conventional method, since first a via plug is first formed and then an interconnect is formed, misalignment may occur while forming the subsequent interconnect. Therefore, the invention can successfully avoid misalignment occurring when a via plug is formed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual damascene process, comprising:

providing a substrate;

forming a conductive line on the substrate;

forming a dielectric layer over the substrate to cover the conductive line;

sequentially forming a first mask layer and a cap oxide layer on the substrate;

defining the cap oxide layer to form an opening to expose a part of the first mask layer wherein the opening is positioned over the substrate in an area where a via hole is to be subsequently formed;

forming a conformal second mask layer along the opening and on the cap oxide layer;

removing a part of the second mask layer to form a spacer on sidewalls of the first opening wherein a part of the first mask layer at a bottom of the opening is simultaneously removed to expose a part of the dielectric layer;

forming a photoresist layer with an interconnect pattern on the cap oxide layer;

anisotropically etching the cap oxide layer and a part of the dielectric layer to form the via hole in the dielectric to expose a part of the conductive line using the photoresist layer and the spacer as a mask and with the first mask layer serving as an etching end point;

removing the photoresist layer;

removing the spacer and the first mask layer exposed by the cap oxide layer to form a horizontal trench using the dielectric layer as an end point; and forming a conductive layer in the via hole and the horizontal trench.

2. The method according to claim 1, wherein the first mask layer comprises silicon nitride.

3. The method according to claim 1, wherein the mask layer is formed by chemical vapor deposition.

4. The method according to claim 1, wherein the cap oxide layer is formed by chemical vapor deposition.

5. The method according to claim 1, wherein the second mask layer is formed by chemical vapor deposition.

6. The method according to claim 1, wherein the part of the second mask layer is removed by dry etching.

7. The method according to claim 1, wherein the second mask layer comprises silicon nitride.

8. The method according to claim 1, wherein the spacer comprise silicon nitride.

* * * * *